(12) United States Patent
Shiraishi et al.

(10) Patent No.: US 7,960,820 B2
(45) Date of Patent: Jun. 14, 2011

(54) SEMICONDUCTOR PACKAGE

(75) Inventors: Akinori Shiraishi, Nagano (JP); Kei Murayama, Nagano (JP); Yuichi Taguchi, Nagano (JP); Masahiro Sunohara, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 46 days.

(21) Appl. No.: 12/265,203

(22) Filed: Nov. 5, 2008

(65) Prior Publication Data

US 2009/0115049 A1 May 7, 2009

(30) Foreign Application Priority Data

Nov. 6, 2007 (JP) ................................. 2007-288907

(51) Int. Cl.
*H01L 23/14* (2006.01)

(52) U.S. Cl. ................. 257/684; 257/E23.008; 438/109
(58) Field of Classification Search .................. 257/680, 257/684, 686, 729, E23.008; 438/106, 107, 438/108, 109, 116
See application file for complete search history.

(56) References Cited

U.S. PATENT DOCUMENTS

| | | | | |
|---|---|---|---|---|
| 4,910,584 A | * | 3/1990 | Mizuo | 257/713 |
| 5,495,398 A | * | 2/1996 | Takiar et al. | 361/790 |
| 6,343,019 B1 | * | 1/2002 | Jiang et al. | 361/761 |
| 6,949,835 B2 | * | 9/2005 | Konishi et al. | 257/777 |
| 2005/0173811 A1 | * | 8/2005 | Kinsman | 257/784 |

FOREIGN PATENT DOCUMENTS

JP   2007-208041   8/2007

* cited by examiner

*Primary Examiner* — Matthew Smith
*Assistant Examiner* — Daniel Shook
(74) *Attorney, Agent, or Firm* — Rankin, Hill & Clark LLP

(57) ABSTRACT

A semiconductor package in which an electronic device chip is provided in a cavity of a silicon substrate stacked product constituted by stacking a plurality of silicon substrates.

13 Claims, 6 Drawing Sheets

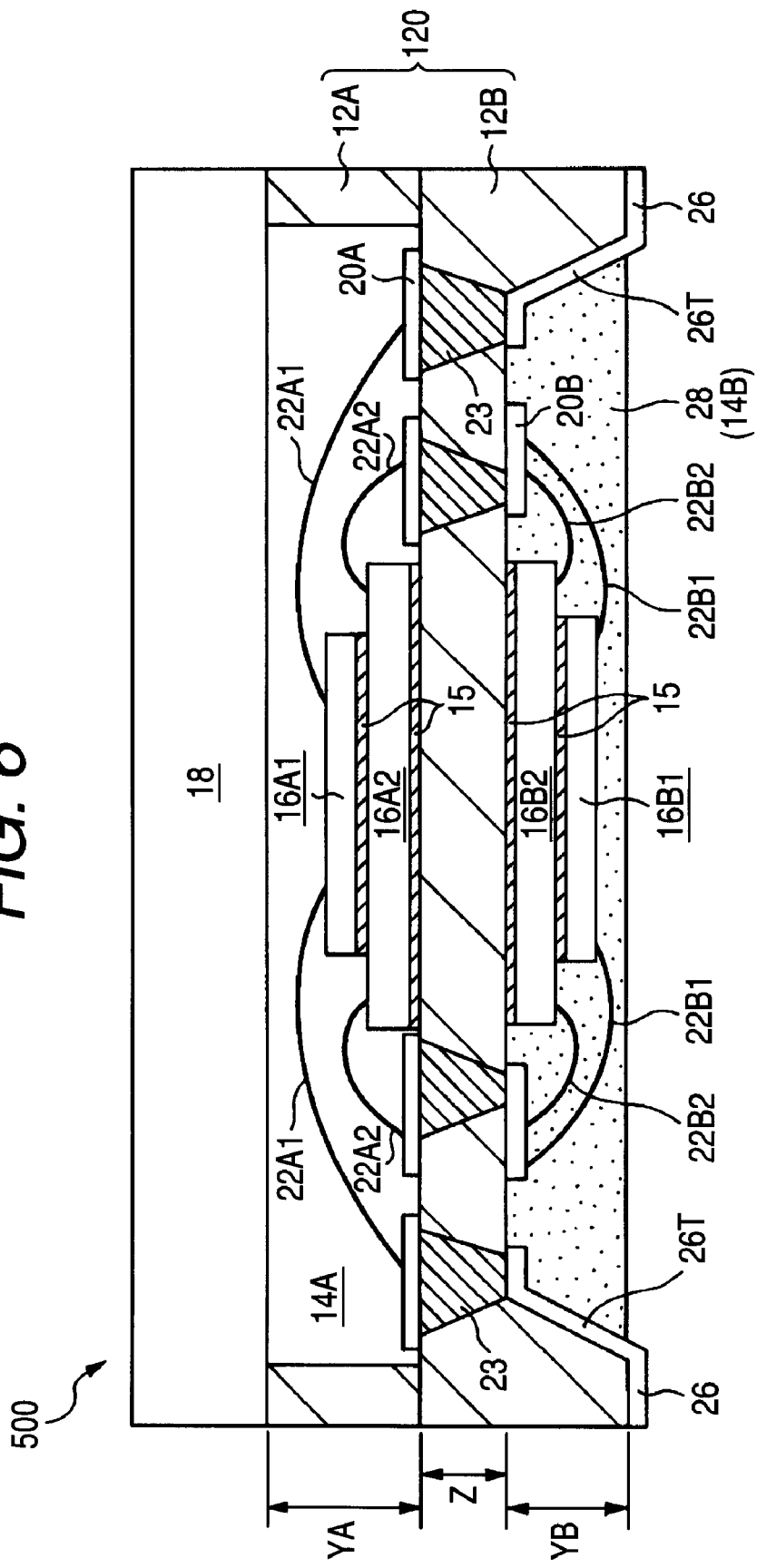

SEMICONDUCTOR PACKAGE

TECHNICAL FIELD

The present disclosure relates to a semiconductor package in which an electronic device chip is provided on a silicon substrate.

RELATED ART

In order to reduce sizes and thicknesses of various electronic apparatuses using a semiconductor apparatus, it is also necessary to correspond to a reduction in a size and a thickness in a semiconductor package used for the semiconductor apparatus. In order to reduce the thickness, particularly, a silicon substrate with a cavity for a package is used (for example, see Patent Document 1). More specifically, an electronic device chip such as a laser diode (LD), a photodiode (PD), a light emitting diode (LED) or a microelectromechanical system (MEMS) is provided in a cavity formed by etching a surface of a substrate to absorb a part or whole of a height of the electronic device chip through the substrate, thereby reducing a thickness of the package. Consequently, it is possible to provide a package having a thickness reduced according to a request specification of a client by using a silicon wafer on the market which has a selection for a thickness restricted into a standard range.

The height of the chip which can be accommodated in a standard thickness of the silicon wafer on the market has a limitation.

In some cases, furthermore, it is important that the electronic device chip is accommodated in the cavity in a separate respect from the reduction in the thickness of the package.

More specifically, in an electronic device chip for carrying out a mechanical operation such as an MEMS, particularly, there is a high possibility that a performance of the electronic device chip might be fatally damaged when an oxidation or a corrosion is generated by an outside atmosphere. Therefore, it is very important that the electronic device chip is stored in the cavity and an opening of the cavity is sealed with an airtight cover to substitute the inner part of the cavity for an inert gas such as nitrogen or argon or to reduce a pressure into a vacuum.

Thus, it is very desirable that the LD, the PD and the LED as well as the MEMS should be stored in a protective atmosphere in the closed cavity in order to guarantee a performance stability for a long period of time.

Furthermore, it is very desirable that a stack having a plurality of electronic device chips stacked can be provided in the cavity in respect of high density mounting. Since a height of the chip which can be stored within a standard thickness of a silicon wafer on the market has a limitation, however, an implementation cannot be performed.

In a related-art semiconductor package 10 shown in FIG. 1, an electronic device chip 16 is provided through an adhesive layer 15 in a cavity 14 of a silicon substrate 12, and an opening of the cavity 14 is sealed with an airtight cover 18 and an inner part of the cavity 14 is substituted for an inert gas. A wiring pattern 20 is formed on a bottom face of the cavity 14 and is connected to an electrode 17 of the electronic device chip 16 through a wire bonding 22. The wiring pattern 20 is led to a back wiring 26 for a connection to a mounting substrate via a through electrode 24.

A relationship between dimensions of respective portions is typically obtained as follows.

For example, in the case in which an 8-inch wafer standardized product on the market is used as the silicon substrate 12, a standard thickness is 725 µm. However, a back face is satin-shaped and mirror finishing is required for use, and a polishing margin thereof is equal to or greater than 50 µm. Therefore, a thickness X of the silicon substrate 12 in an actual using state is equal to or smaller than 675 µm, for example.

A bottom part of the cavity 14 is set to have a thickness Z of 200 µm in order to ensure a mechanical strength, for example.

As a result, a height Y of a space to be the cavity 14 is equal to or smaller than 475 µm (Y=X−Z≦675−200=475).

In the case in which a height W above the electronic device chip 16 needs to be 150 µm and a total T of a chip mounting solder and a metal thickness needs to be 25 µm in order to enable the wire bonding 22, furthermore, a height H of the chip 16 which can be actually stored in the cavity 14 is equal to or smaller than 300 µm (H=Y−W−T≦475−150−25=300).

In related-art in-cavity mounting, thus, an allowable height of a chip to be mounted is restricted greatly.

[Patent Document 1] Japanese Patent Unexamined Application Publication No. 2007-208041

SUMMARY

Exemplary embodiments of the present invention provide a semiconductor package in which an electronic device chip is provided in a cavity of a silicon substrate beyond a limitation of a chip mounting height based on a standard thickness of a silicon substrate on the market.

An exemplary embodiment of the present invention provides a semiconductor package comprising a silicon substrate stacked product formed by stacking a plurality of silicon substrates, the silicon substrate stacked product having a cavity, and an electronic device chip provided in the cavity of the silicon substrate stacked product.

According to the invention, the cavity is provided on the silicon substrate stacked product constituted by stacking the silicon substrates. Consequently, it is possible to achieve a height of the cavity without a restriction to a standard thickness of the single silicon substrate, and to store and provide, in the cavity, the electronic device chip or electronic device chip stack having a height in which the mounting cannot be carried out in the related-art.

Other features and advantages may be apparent from the following detailed description, the accompanying drawings and the claims.

BRIEF DESCRIPTION OF THE DRAWINGS

FIG. 6 is a sectional view showing a semiconductor package in which an electronic device chip is stored and provided in a cavity formed in a silicon substrate stacked product obtained by stacking a plurality of silicon substrates according to a fifth embodiment of the invention.

DETAILED DESCRIPTION

First Embodiment

Figure 1:
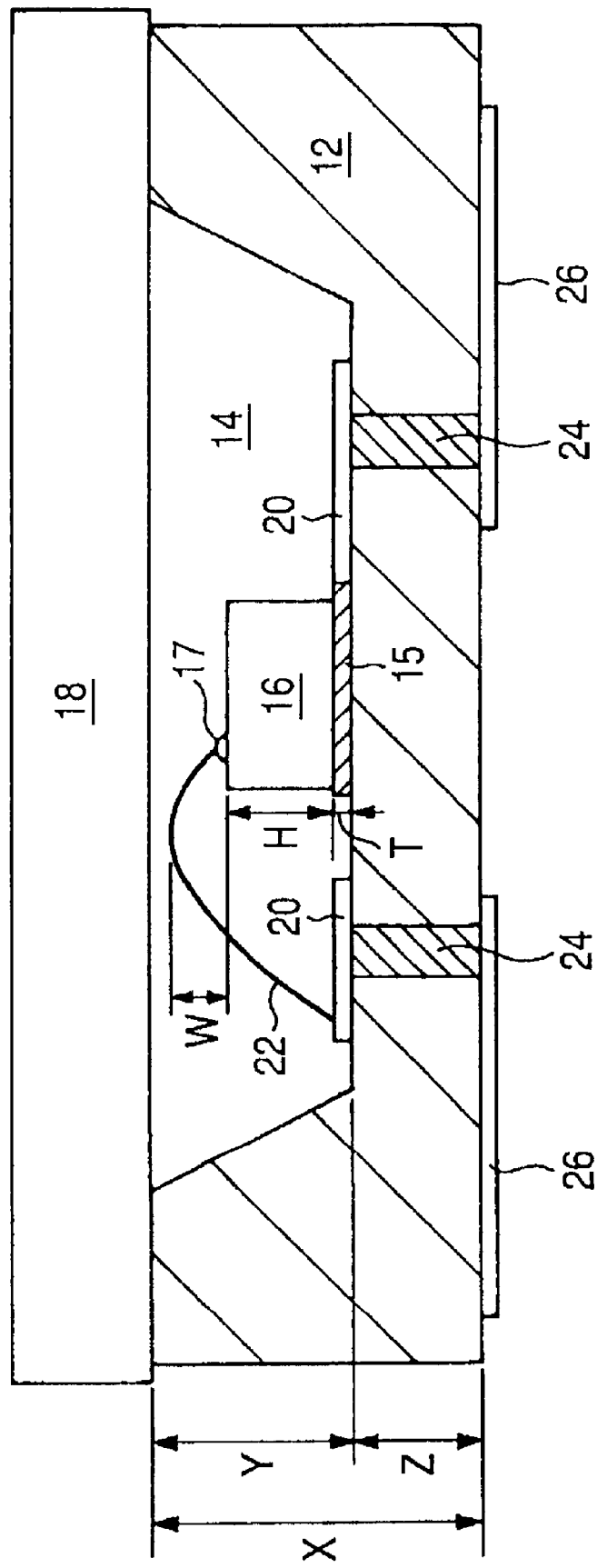
FIG. 1 is a sectional view showing a semiconductor package in which an electronic device chip is stored and provided in a cavity formed in a single silicon substrate according to the related art.
Figure 2:
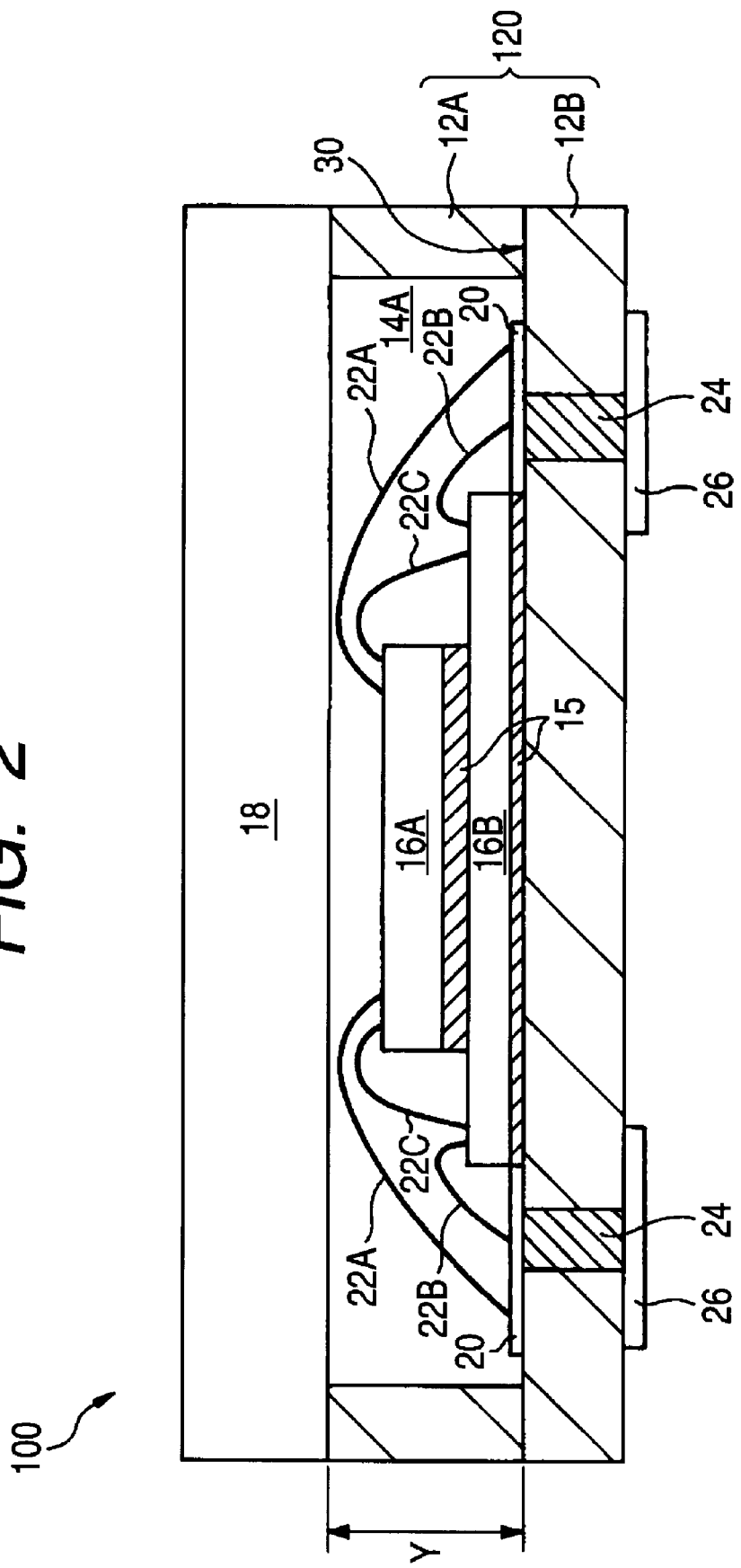
FIG. 2 is a sectional view showing a semiconductor package in which an electronic device chip is stored and provided in a cavity formed in a silicon substrate stacked product obtained by stacking a plurality of silicon substrates according to a first embodiment of the invention.

A semiconductor package 100 shown in FIG. 2 has a structure in which a silicon substrate 12A having a cavity 14A to be a through hole formed and taking a shape of a window frame is stacked on another silicon substrate 12B through a bonding surface 30 to form a silicon substrate stacked product 120. Corresponding members to the members shown in FIG. 1 have the same reference numerals as shown in FIG. 1. In the case in which a plurality of corresponding members is provided, alphabet is added to an end of the reference numeral for a distinction. Moreover, unnecessary detail portions for understanding the invention, for example, an oxide insulating film of a surface of a silicon substrate and an electrode of an electronic device chip are not shown and simple and clear description is given.

In the embodiment, a total thickness of the silicon substrate 12A on which the through cavity 14A taking the shape of a window frame is formed can be utilized as a height Y of the cavity 14A. For example, in the case in which an 8-inch wafer standardized product on the market is used as the silicon substrate 12A in the same manner as in FIG. 1, a maximum value of 675 μm in a thickness after polishing can be exactly utilized as a maximum value of the height Y of the cavity 14A.

An electronic device chip 16B is provided through an adhesive layer 15 on a bottom face of the cavity 14A which is defined by an upper surface of the lower silicon substrate 12B, and furthermore, an electronic device chip 16A of a different type or the same type is provided thereon through the adhesive layer 15 so that a stack constituted by two electronic device chips 16A/16B is provided.

A wiring pattern 20 is formed on the bottom face of the cavity and is led to a back wiring 26 for a connection to a mounting substrate via a through electrode 24 penetrating the lower silicon substrate 12B.

The electronic device chips 16A and 16B and the wiring pattern 20 are connected through wire bondings 22A and 22B respectively, and the electronic device chips 16A and 16B are connected to each other through a wire bonding 22C.

Although the stack of the two electronic device chips 16A and 16B is provided in the example shown in the drawing, it is also possible to provide a single electronic device chip having a great height. As a matter of course, it is also possible to provide at least three electronic device chips having small heights, which departs from the object of the invention.

It is desirable that the bonding of the two silicon substrates 12A and 12B through the bonding portion 30 should be carried out by a bonding method capable of ensuring an airtightness. It is possible to apply a bonding method such as direct bonding of silicon, adhesive bonding, or wax or solder bonding which has been known in the related art.

For a cover 18, it is possible to use various materials which can ensure an airtightness, for example, glass, plastic, silicon or metal. In the case in which a transparency is required, the glass or the plastic is used. For example, in the case in which the glass is used as the cover 18, it is desirable to carry out bonding to the silicon substrate 12A through anode bonding. As a matter of course, another airtight bonding such as the adhesive bonding may be employed.

Second Embodiment

Figure 3:
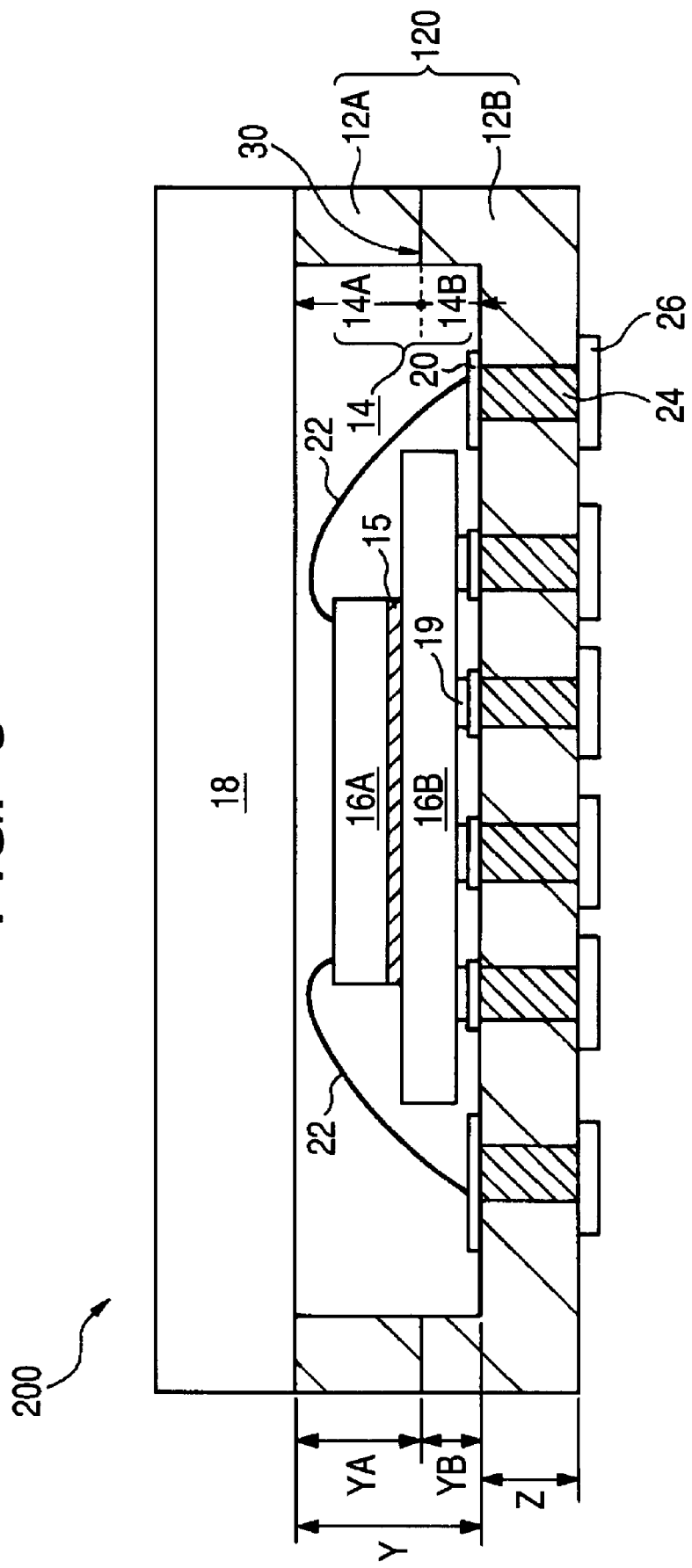
FIG. 3 is a sectional view showing a semiconductor package in which an electronic device chip is stored and provided in a cavity formed in a silicon substrate stacked product obtained by stacking a plurality of silicon substrates according to a second embodiment of the invention.

A semiconductor package 200 shown in FIG. 3 has a structure in which a silicon substrate 12A having a cavity 14A to be a through hole formed and taking a shape of a window frame is stacked through a bonding surface 30 on another silicon substrate 12B having a cavity 14B formed as a bottomed hole, and a silicon substrate stacked product 120 is thus formed. Corresponding members to the members shown in FIG. 1 have the same reference numerals as those in FIG. 1. In the case in which a plurality of corresponding members is provided, alphabet is added to an end of the reference numeral for a distinction.

In the embodiment, a total height of the through cavity 14A having a height corresponding to a total thickness of the silicon substrate 12A and taking a shape of a window frame and the bottomed cavity 14B of the silicon substrate 12B can be utilized as a height Y of the cavity 14. For example, in the case in which an 8-inch wafer standardized product on the market is used as the silicon substrates 12A and 12B in the same manner as in FIG. 1, a maximum value of 675 μm in a thickness after polishing can be exactly utilized as a maximum value of a height YA of the cavity 14A for the silicon substrate 12A. In addition, referring to the silicon substrate 12B, 475 μm obtained by subtracting a bottom thickness of 200 μm from 675 μm can be utilized as a maximum value of a height YB of the cavity 14B. For the height Y of the cavity 14, accordingly, 1150 μm can be utilized as a maximum value for a total of the height YA of the cavity 14A and the height YB of the cavity 14B (Y=YA+YB≦675+475=1150).

A wiring pattern 20 is formed on a bottom face of the cavity 14 which is constituted by the lower silicon substrate 12B and an electronic device chip 16B is provided thereon through a bump 19 by a flip-chip bonding, and furthermore, an electronic device chip 16A of a different type or the same type is provided thereon through an adhesive 15. Thus, they are provided as a stack constituted by the two electronic device chips 16A and 16B.

The electronic device chip 16A is connected to the wiring pattern 20 through a wire bonding 22.

The wiring pattern 20 formed on the bottom face of the cavity is led to a back wiring 26 for a connection to a mounting substrate via a through electrode 24 penetrating the lower silicon substrate 12B.

For the number of the electronic device chips which are provided, a method of bonding the silicon substrates, a material of the cover and a method of bonding the cover to the silicon substrate, the same selection as that in the first embodiment can be employed.

Third Embodiment

Figure 4:
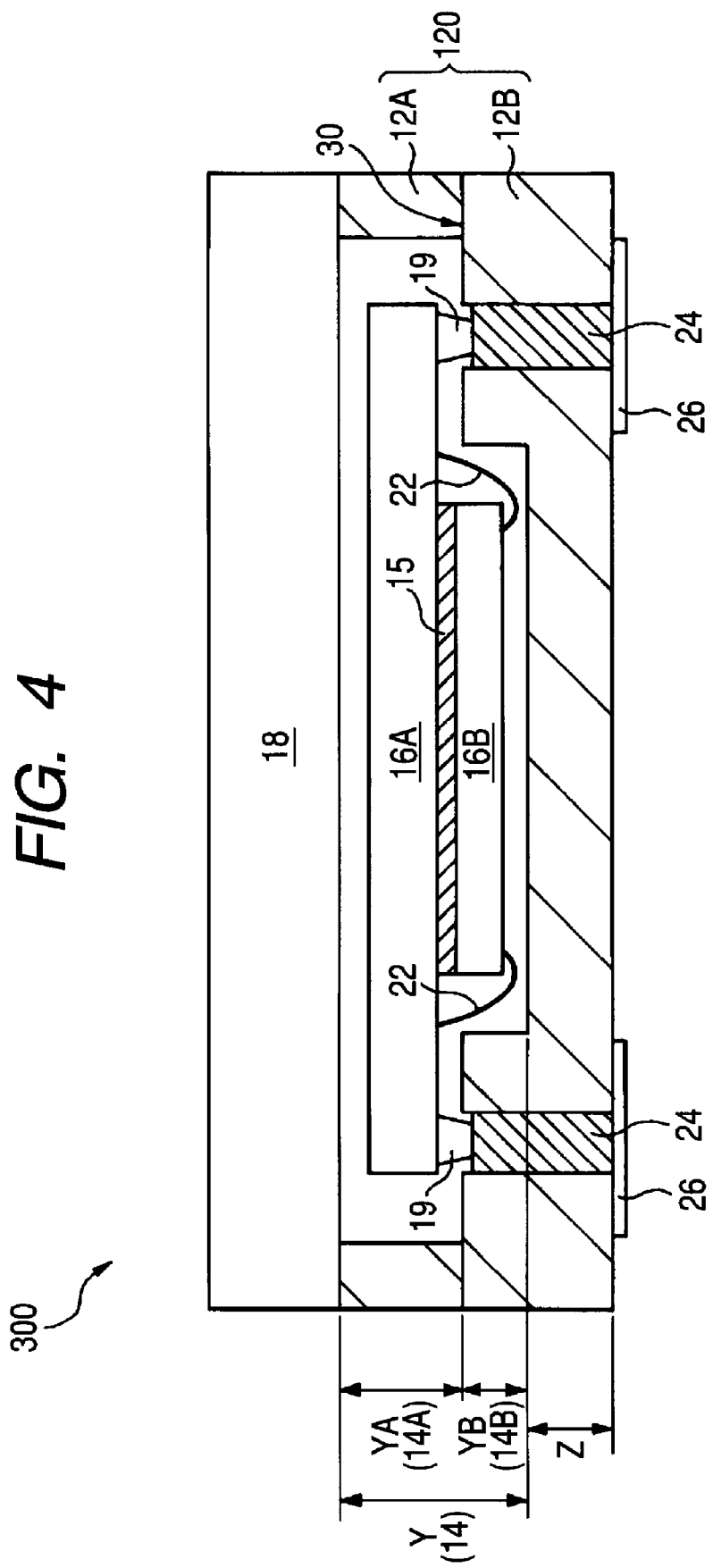
FIG. 4 is a sectional view showing a semiconductor package in which an electronic device chip is stored and provided in a cavity formed in a silicon substrate stacked product obtained by stacking a plurality of silicon substrates according to a third embodiment of the invention.

A semiconductor package 300 shown in FIG. 4 has a structure in which a silicon substrate 12A having a cavity 14A to be a through hole formed and taking a shape of a window frame is stacked through a bonding surface 30 on another silicon substrate 12B having a cavity 14B to be a bottomed hole, and a silicon substrate stacked product 120 is thus formed. Corresponding members to the members shown in FIG. 1 have the same reference numerals as those in FIG. 1. In the case in which a plurality of corresponding members is provided, alphabet is added to an end of the reference numeral for a distinction.

In the embodiment, a total height of the through cavity 14A having a height corresponding to a total thickness of the silicon substrate 12A and the bottomed cavity 14B of the silicon substrate 12B can be utilized as a height Y of the cavity 14 in the same manner as in the second embodiment. For example, in the case in which an 8-inch wafer standardized product on the market is used as the silicon substrates 12A and 12B in the same manner as in FIG. 1, a maximum value of 675 μm in a thickness after polishing can be exactly utilized as a maximum value of a height YA of the cavity 14A for the silicon substrate 12A. In addition, referring to the silicon substrate 12B, 475 μm obtained by subtracting a bottom thickness of 200 μm from 675 μm can be utilized as a maximum value of a height YB of the cavity 14B. For the height Y of the cavity 14, accordingly, 1150 μm can be utilized as a maximum value for a total of the height YA of the cavity 14A and the height YB of the cavity 14B (Y=YA+YB≦675+475=1150).

An electronic device chip 16B of a different type or the same type is provided on an electronic device chip 16A through an adhesive layer 15, and both of the chips 16A and 16B are connected to each other through a wiring bonding 22 to form a stack. The stack is turned over to carry out a flip-chip bonding to an upper end of a through electrode 24 of the lower silicon substrate 12B via a bump 19 of the electronic device chip 16A. Consequently, the bump 19 of the electronic device chip 16B is led to a back wiring 26 for a connection to a mounting substrate.

For the number of the electronic device chips which are provided, a method of bonding the silicon substrates, a material of the cover and a method of bonding the cover to the silicon substrate, the same selection as that in the first embodiment can be employed.

Fourth Embodiment

Figure 5:
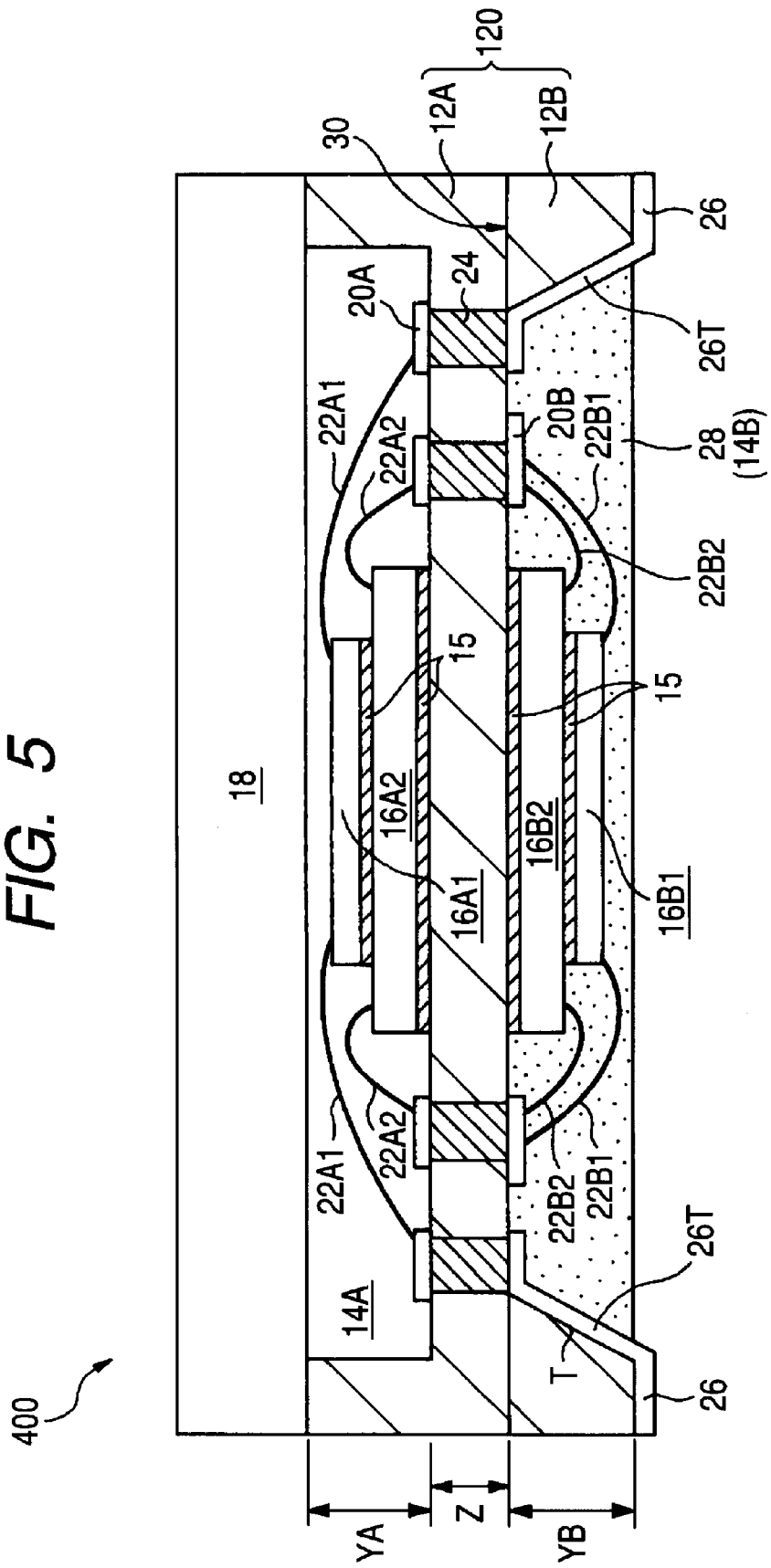
FIG. 5 is a sectional view showing a semiconductor package in which an electronic device chip is stored and provided in a cavity formed in a silicon substrate stacked product obtained by stacking a plurality of silicon substrates according to a fourth embodiment of the invention.

A semiconductor package 400 shown in FIG. 5 has such a structure that a silicon substrate 12A having a cavity 14A to be a bottomed hole is stacked on a silicon substrate 12B having a cavity 14B to be a through hole with a taper which is opened and taking a shape of a window frame through a back face of a bottom part of the silicon substrate 12A set to be a bonding surface 30, and a silicon substrate stacked product 120 is thus formed. More specifically, the bottom part of the cavity 12A is set to be a boundary region, and the cavities 12A and 12B are vertically opened respectively. Members corresponding to the members shown in FIG. 1 have the same reference numerals as those in FIG. 1. In the case in which a plurality of corresponding members is provided, alphabet or alphabet and a figure is/are added to an end of the reference numeral for a distinction.

In the embodiment, referring to the upper silicon substrate 12A, the bottomed cavity 14A has a maximum height (475 μm) obtained by subtracting a thickness Z of the bottom part from a thickness (675 μm: 8-inch wafer, and so forth) after polishing of a wafer put on the market in the same as in the related-art structure shown in FIG. 1. Referring to the silicon substrate 12B, however, the through cavity 14B taking the shape of a window frame can be utilized by setting, as a maximum height, a total thickness (675 μm) after polishing of the wafer put on the market in the same manner as in the first embodiment of FIG. 2 and the third embodiment of FIG. 4.

An electronic device chip 16A2 is provided on a bottom face of the cavity 14A through an adhesive layer 15 in the upper cavity 14A, and an electronic device chip 16A1 of a different type or the same type is provided thereon through the adhesive layer 15 to form a stack. The electronic device chips 16A1 and 16A2 are connected to a wiring pattern 20A on the bottom face of the cavity 14A through wire bondings 22A1 and 22A2, respectively. The upper cavity 14A is sealed in airtightness by means of a cover 18 bonded to the silicon substrate 12A, and an inner part is substituted for an inert gas or is brought into a vacuum state.

In the lower cavity 14B, an electronic device chip 16B2 is provided through the adhesive layer 15 on a bottom face constituted by a back face of the silicon substrate 12A and an electronic device chip 16B1 of a different type or the same type is provided thereon through the adhesive layer 15 to form a stack. The electronic device chips 16A and 16B are connected to a wiring pattern 20B on a bottom face of the cavity 14B through wire bondings 22B1 and 22B2, respectively. An inner part of the lower cavity 14B is actually filled with a mold resin 28. At a peripheral edge of the lower cavity 14B, the wiring pattern 20B is led to a back wiring 26 for a connection to a mounting substrate through a taper wiring 26T.

For the number of the electronic device chips which are provided, a method of bonding the silicon substrates, a material of the cover and a method of bonding the cover to the silicon substrate, the same selection as that in the first embodiment can be employed.

Fifth Embodiment

A semiconductor package 500 shown in FIG. 6 has such a structure that a silicon substrate 12A having a cavity 14A to be a through hole and taking a shape of a window frame is stacked on a silicon substrate 12B having a cavity 14B to be a bottomed hole formed through a back face of a bottom part of the silicon substrate 12B set to be a bonding surface 30, and a silicon substrate stacked product 120 is thus formed. More specifically, the bottom part of the cavity 12B is set to be a boundary region, and the cavities 12A and 12B are vertically opened respectively. Members corresponding to the members shown in FIG. 1 have the same reference numerals as those in FIG. 1. In the case in which a plurality of corresponding members is provided, alphabet or alphabet and a figure is/are added to an end of the reference numeral for a distinction.

In the embodiment, referring to the upper silicon substrate 12A, the through cavity 14A can be utilized by setting, as a maximum height, a total thickness (675 μm) after polishing of the wafer put on the market in the same manner as in the first embodiment and the third embodiment of FIG. 4, and referring to the silicon substrate 12B, the bottomed cavity 14B has a maximum height (475 μm) obtained by subtracting a thickness Z of the bottom part from a thickness (675 μm: 8-inch wafer, and so forth) after polishing of a wafer put on the market in the same manner as in the related-art structure shown in FIG. 1.

An electronic device chip 16A2 is provided on a bottom face constituted by the back face of the silicon substrate 12B through an adhesive layer 15 in the upper cavity 14A, and an electronic device chip 16A1 of a different type or the same type is provided thereon through the adhesive layer 15 to form a stack. The electronic device chips 16A1 and 16A2 are connected to a wiring pattern 20A on the bottom face of the cavity 14A through wire bondings 22A1 and 22A2, respectively. The upper cavity 14A is sealed in airtightness by means of a cover 18 bonded to the silicon substrate 12A, and an inner part is substituted for an inert gas or is brought into a vacuum state.

In the lower cavity 14B, an electronic device chip 16B2 is provided through the adhesive layer 15 on a bottom face of the cavity 14B and an electronic device chip 16B1 of a different type or the same type is provided thereon through the adhesive layer 15 to form a stack. The electronic device chips 16B1 and 16B2 are connected to a wiring pattern 20B on a bottom face of the cavity 14B through wire bondings 22B1 and 22B2, respectively. An inner part of the lower cavity 14B is actually filled with a mold resin 28. At a peripheral edge of the lower cavity 14B, the wiring pattern 20B is led to a back wiring 26 for a connection to a mounting substrate through a taper wiring 26T.

The wiring pattern 20A in the upper cavity 14A and the wiring pattern 20B in the lower cavity 14B are connected to each other through a via 23 penetrating a bottom part of the lower silicon substrate 12B.

For the number of the electronic device chips which are provided, a method of bonding the silicon substrates, a material of the cover and a method of bonding the cover to the silicon substrate, the same selection as that in the first embodiment can be employed.

According to the invention, there is provided a semiconductor package in which an electronic device chip is provided in a cavity of a silicon substrate beyond a limitation of a chip mounting height based on a standard thickness of a silicon substrate on the market.

What is claimed is:

1. A semiconductor package comprising:
    a silicon substrate stacked product formed by stacking a plurality of silicon substrates, the silicon substrate stacked product including a first single silicon substrate having a first cavity to be a through hole and a second single silicon substrate having a second cavity to be a bottomed hole, the first single silicon substrate being mounted to a side of the second single silicon substrate in which the second cavity is formed, and said silicon substrate stacked product having a first cavity side and a second cavity side; and
    a plurality of electronic device chips stacked and mounted on the second cavity side of the silicon substrate stacked product, at least one of the electronic device chips is electrically connected to a through electrode formed in the second single silicon substrate via a bump.

2. The semiconductor package according to claim 1, further comprising:
    an airtight cover which covers an opening portion of the second cavity.

3. The semiconductor package according to claim 1, wherein an opening of a bottom part of the bottomed hole of the second single silicon substrate is linked to the through hole of the first single silicon substrate.

4. A semiconductor package comprising:
    a silicon substrate stacked product formed by stacking a plurality of silicon substrates, the silicon substrate stacked product including a first single silicon substrate having a first cavity to be a through hole and a second single silicon substrate having a second cavity to be a bottomed hole, the first single silicon substrate being bonded to a first face of the second single silicon substrate which is opposite to a second face of the second single silicon substrate from which the second cavity is formed;
    a through electrode formed in the second single silicon substrate; and
    an electronic device chip provided in one of the first cavity and the second cavity of the silicon substrate stacked product.

5. The semiconductor package according to claim 4, wherein a first plurality of electronic device chips is mounted in the first cavity and a second plurality of electronic device chips is mounted in the second cavity.

6. The semiconductor package according to claim 5, wherein a bottom part of the bottomed hole of the second single silicon substrate includes the first face and the second face, the first plurality of electronic device chips being provided on the first face, the second plurality of electronic device chips being provided on the second face.

7. The semiconductor package according to claim 6, further including:
    a first wiring pattern located on the first face and electrically connected to the first plurality of electronic device chips,
    a second wiring pattern located on the second face and electrically connected to the second plurality of electronic device chips, and
    the through electrode extending through the bottom part for electrically connecting the first wiring pattern to the second wiring pattern.

8. The semiconductor package according to claim 7, further including a wiring provided on a sidewall of the first cavity and a back wiring located at a peripheral edge of the first cavity, the wiring electrically connecting the first wiring pattern and the back wiring.

9. The semiconductor package according to claim 5, wherein one of the first cavity and second cavity is filled with resin.

10. The semiconductor package according to claim 4, wherein the electronic device chip is electrically connected to the through electrode formed in the second single silicon substrate.

11. The semiconductor package according to claim 4, wherein the first single silicon substrate has a tapered shape.

12. The semiconductor package according to claim 4, wherein the second single silicon substrate has a tapered shape.

13. The semiconductor package according to claim 4, wherein the through electrode formed in the second single silicon substrate has a tapered shape.

* * * * *